United States Patent
Jha et al.

(10) Patent No.: US 10,989,382 B2
(45) Date of Patent: Apr. 27, 2021

(54) AIRCRAFT LIGHTING DEVICE HAVING OPTICAL ELEMENT MAGNETICALLY COUPLED TO LED CIRCUIT BOARD

(71) Applicant: Goodrich Lighting Systems GmbH, Lippstadt (DE)

(72) Inventors: Anil Kumar Jha, Lippstadt (DE); Andre Hessling-Von Heimendahl, Koblenz (DE); Elmar Schrewe, Anroechte (DE)

(73) Assignee: GOODRICH LIGHTING SYSTEMS GMBH, Lippstadt (DE)

( * ) Notice: Subject to any disclaimer, the term of this patent is extended or adjusted under 35 U.S.C. 154(b) by 0 days.

(21) Appl. No.: 16/702,605

(22) Filed: Dec. 4, 2019

(65) Prior Publication Data
US 2020/0363031 A1 Nov. 19, 2020

(30) Foreign Application Priority Data

May 17, 2019 (EP) .................................. 19175028

(51) Int. Cl.

| | |
|---|---|
| *F21V 17/10* | (2006.01) |
| *F21S 41/143* | (2018.01) |
| *B60Q 3/44* | (2017.01) |
| *F21S 41/19* | (2018.01) |
| *F21S 41/29* | (2018.01) |
| *F21S 41/32* | (2018.01) |
| *F21S 41/20* | (2018.01) |
| *F21S 41/39* | (2018.01) |

(Continued)

(52) U.S. Cl.
CPC .............. *F21S 41/143* (2018.01); *B60Q 3/44* (2017.02); *B64D 11/00* (2013.01); *B64D 47/04* (2013.01); *F21S 41/192* (2018.01); *F21S 41/285* (2018.01); *F21S 41/29* (2018.01); *F21S 41/321* (2018.01); *F21S 41/39* (2018.01); *H05K 3/0047* (2013.01); *B64D 2011/0053* (2013.01); *F21S 41/153* (2018.01); *F21W 2106/00* (2018.01); *F21W 2107/30* (2018.01); *F21Y 2115/10* (2016.08); *H05K 2201/10106* (2013.01); *H05K 2201/10121* (2013.01); *H05K 2201/10522* (2013.01)

(58) Field of Classification Search
CPC ........ F21V 17/105; F21V 7/06; F21V 7/0066; F21W 2107/30
See application file for complete search history.

(56) References Cited

U.S. PATENT DOCUMENTS 2,147,482 A * 2/1939 Butler .................... F21V 17/105
                                                      362/433
2,953,970 A * 9/1960 Maynard ................ G03B 17/12
                                                      359/611

(Continued)

OTHER PUBLICATIONS

European Search Report for Applicaiton No. 19175028.0-1010, dated Oct. 30, 2019, 9 pages.

*Primary Examiner* — Ismael Negron
(74) *Attorney, Agent, or Firm* — Cantor Colburn LLP (57) ABSTRACT

An aircraft lighting device includes a circuit board; an LED soldered to the circuit board; an optical element supported by the circuit board and positioned for re-directing at least part of the light emitted by the LED; a magnetic coupling between the circuit board and the optical element; and at least one surface mounted device included in the optical element, such surface mounted device including a pin soldered to the circuit board.

19 Claims, 10 Drawing Sheets

(51) Int. Cl.
   *B64D 11/00* (2006.01)
   *B64D 47/04* (2006.01)
   *H05K 3/00* (2006.01)
   *F21Y 115/10* (2016.01)
   *F21W 107/30* (2018.01)
   *F21W 106/00* (2018.01)
   *F21S 41/153* (2018.01)

(56) References Cited

U.S. PATENT DOCUMENTS

| | | | | |
|---|---|---|---|---|
| 3,355,583 | A * | 11/1967 | Christoffel | F21V 17/105 362/433 |
| 4,536,732 | A * | 8/1985 | Schindl | G02B 7/14 24/303 |
| 7,145,179 | B2 * | 12/2006 | Petroski | F21V 21/096 257/81 |
| 8,096,677 | B2 | 1/2012 | Fields et al. | |
| 8,651,711 | B2 * | 2/2014 | Rudisill | F21V 29/507 362/398 |
| 8,858,045 | B2 * | 10/2014 | Harbers | F21V 29/505 362/433 |
| 9,080,741 | B2 * | 7/2015 | Mignot | F21S 2/005 |
| 9,217,560 | B2 * | 12/2015 | Harbers | F21V 29/00 |
| 9,696,008 | B2 * | 7/2017 | Hunter | F21V 7/06 |
| 10,113,710 | B2 | 10/2018 | Feurle et al. | |
| 10,197,242 | B2 | 2/2019 | Donato et al. | |
| 10,578,267 | B2 * | 3/2020 | Bowles | F21S 41/148 |
| 2008/0247160 | A1 * | 10/2008 | Jiang | F21V 33/0012 362/227 |
| 2008/0298056 | A1 * | 12/2008 | Petersen | F21V 17/105 362/235 |
| 2013/0044501 | A1 | 2/2013 | Rudisill et al. | |
| 2014/0233245 | A1 | 8/2014 | Kerpe | |
| 2015/0091031 | A1 | 4/2015 | Biehle | |
| 2018/0112844 | A1 | 4/2018 | Bowles et al. | |

* cited by examiner

AIRCRAFT LIGHTING DEVICE HAVING OPTICAL ELEMENT MAGNETICALLY COUPLED TO LED CIRCUIT BOARD

FOREIGN PRIORITY

This application claims priority to European Patent Application No. 19175028.0 filed May 17, 2019, the entire contents of which is incorporated herein by reference.

TECHNICAL FIELD

The present invention is in the field of lighting devices. In particular, the present invention is in the field of lighting devices for aircraft and aircraft equipped with such lighting devices. The present invention is also in the field of manufacturing lighting devices.

BACKGROUND

Modern aircraft, such as large commercial passenger airplanes, have a vast range of lighting devices. On the one hand, a variety of exterior aircraft lights, such as headlights, navigation lights, anti-collision lights, wing/engine scan lights, etc. are typically provided. On the other hand, a variety of interior aircraft lights, such as cabin illumination lights, reading lights, exit sign lights, etc. are also typically provided. Modern commercial passenger airplanes have a very large number of lighting devices.

In recent years, lighting devices with traditional light sources have increasingly been replaced by lighting devices with light emitting diodes (LEDs) as light sources. This has led to lighting devices where LEDs and optical elements are arranged on and supported by circuit boards. With LEDs being small light sources, lighting devices have been developed that have a small space envelope. The LEDs and the optical elements are arranged in close proximity to the circuit boards, leading to low overall space requirements. However, such lighting devices are not always satisfactory in terms of mechanical stability and accuracy of the light output.

Accordingly, it would be beneficial to provide a lighting device with high mechanical stability and a framework for high accuracy of the light output. Also, it would be beneficial to provide an aircraft equipped with such lighting device(s). Further, it would be beneficial to provide a method for manufacturing such lighting device(s) in an efficient manner.

SUMMARY

Exemplary embodiments of the invention include a lighting device, comprising a circuit board; an LED, soldered to the circuit board; an optical element, supported by the circuit board and positioned for re-directing at least part of the light, in operation emitted by the LED; and a magnetic coupling between the circuit board and the optical element.

Exemplary embodiments of the invention allow for a strong mechanical attachment between the circuit board and the optical element, while providing a framework for accurately positioning the optical element with respect to the LED and, thus, for achieving a highly accurate light output of the lighting device. The magnetic coupling provides for a strong attachment between the circuit board and the optic element. In particular, the magnetic coupling may be embodied in such a way that large forces would have to be applied in the z-direction of the circuit board, in order to separate the optical element from the circuit board. The strength of the magnetic coupling may be conveniently dimensioned in accordance with the expected mechanical loads during operation of the lighting device. Further, the magnetic coupling may provide some wiggle room between the optical element and the circuit board in the x-y-plane of the circuit board, such that separate positioning mechanisms may align the optical element and the LED with high accuracy. In this way, a highly accurate light output may be achieved, without compromising the strong mechanical attachment between the circuit board and the optical element, effected by the magnetic coupling.

The lighting device comprises a magnetic coupling between the circuit board and the optical element. The magnetic coupling is provided for attaching the optical element to the circuit board. In particular, the magnetic coupling may provide the main attachment between the optical element and the circuit board. It may be the strongest component of the overall attachment between the optical element and the circuit board. However, it is possible that other ancillary forms of attachment between the optical element and the circuit board are provided, as will be described below.

The optical element is supported by the circuit board and positioned for re-directing at least part of the light, in operation emitted by the LED. The LED and the optical element have a geometric relationship/arrangement that allows for the optical element to affect the light emitted by the LED and to contribute to shaping the light output of the lighting device. The optical element may be configured to affect part of the light in operation emitted by the LED or all of the light in operation emitted by the LED. In particular, the optical element may have an extension and a position that allows for affecting all of the light in operation emitted by the LED or part of the light in operation emitted by the LED. The LED and the optical element jointly form a design unit, also referred to as structural unit or building block herein, with the designs and relative positioning of the LED and the optical element determining the contribution of this design unit to the light output. Exemplary embodiments of the invention allow for such structural units, consisting of an LED and an optical element, to work at or very closely to their design specifications. This in turn contributes to a high accuracy of the light output of the lighting device. In case a lighting device has a plurality of such structural units, consisting of an LED and an optical element, the beneficial effects of the magnetic coupling of the optical elements to the circuit board may be made use of to a particularly high degree.

The lighting device comprises a circuit board. The LED is soldered to the circuit board, and the optical element is attached to the circuit board via the magnetic coupling. The circuit board may be a printed circuit board (PCB). The circuit board may be a pre-produced circuit board, having a pad for the LED to be soldered to.

The magnetic coupling between the circuit board and the optical element allows for a quick and little complex attachment of the optical element to the circuit board during manufacture. As compared to previous approaches, which involved screwing, gluing, hot stamping, snap fitting, etc., the magnetic coupling is less labor intensive and less time consuming. Further, it may require less complex tooling and less post-operation.

According to a further embodiment, the optical element is a reflector. The reflector may be effectively attached to the circuit board via the magnetic coupling. In particular, the reflector may be arranged around the LED and may have a collimating effect on the light, in operation emitted by the LED. In a particular embodiment, the reflector is a parabolic reflector. In particular, the reflector may be a substantially rotationally symmetric reflector. The LED may be positioned substantially on the center axis of the parabolic reflector. The degree of collimation by the parabolic reflector may be affected by the extension of the parabolic reflector above the circuit board. The parabolic reflector may collimate light in a z-direction of the circuit board, i.e. in a direction normal to the circuit board.

According to a further embodiment, the optical element is a lens. In particular, the optical element may be a collimating lens. Further in particular, the lens may collimate light from the LED in a z-direction of the circuit board. The lens may also be effectively attached to the circuit board via the magnetic coupling. The term lens refers to a refractive optical element, re-directing light from the LED via refraction.

According to a further embodiment, the magnetic coupling comprises a permanent magnet at the optical element and a ferromagnetic element at the circuit board. According to an alternative embodiment, the magnetic coupling comprises a ferromagnetic element at the optical element and a permanent magnet at the circuit board. According to a further alternative embodiment, the magnetic coupling comprises a first permanent magnet at the optical element and a second permanent magnet at the circuit board. In the case of a first permanent magnet being provided at the optical element and second permanent magnet being provided at the circuit board, the first and second permanent magnets have opposite polarities. This results in an attractive force between the first permanent magnet and the second permanent magnet. In case of a permanent magnet being provided at either the optical element or the circuit board and a ferromagnetic element being provided at the other one of the optical element and the circuit board, the permanent magnet may have any polarity. The permanent magnet and the ferromagnetic element may be press-fit into the optical element and the circuit board, respectively. Also, the first permanent magnet and the second permanent magnet may be press-fit into the optical element and the circuit board, respectively.

According to a further embodiment, the optical element comprises at least one surface mounted device pin (SMD pin), soldered to the circuit board. The soldered connection between the optical element and the circuit board may provide for an accurate positioning between the circuit board and the optical element. In particular, with the LED and the optical element both being soldered to the circuit board, a highly accurate relative positioning between the LED and the optical element may be achieved. In particular, the circuit board may have soldering pads for the LED and the optical element, which can be provided with high accuracy. With the LED and the optical element both being soldered to the circuit board, potential swimming or shifting of the surface mounted device pin(s) of the optical element and the pin(s) of the LED may affect both components in the same or substantially the same manner. In this way, the relative positioning between the optical element and the LED may be very accurate, despite potential shifts during the soldering process.

According to a further embodiment, the lighting device further comprises at least one positioning component, soldered to the circuit board and extending from the circuit board, wherein the optical element has at least one recess, with each of the at least one positioning component being arranged in an associated one of the at least one recess. In this way, the positioning between the optical element and the circuit board may be achieved via the geometric matching of the positioning component(s), extending from the circuit board, and the recess(es) in the optical element. With the at least one positioning component being soldered to the circuit board, above described maintenance of the relative positioning between the LED and the optical element during the soldering process may also be achieved. Further, the attaching of the optical element to the circuit board may be carried out at a later point in time than the soldering of the LED and the at least one positioning component to the circuit board. In this way, the provision of the framework for accurately positioning the optical element and the attaching of the optical element may be de-coupled in time.

In a particular embodiment, the at least one positioning component is at least one positioning LED. At first glance, it seems to be a waste to use one or more LEDs for positioning, without using their light emission capacities. However, a highly similar swimming and/or shift of the LED, whose light emission contributes to the light output of the lighting device, and the positioning LED(s) may be achieved due to the use of the same kind of components. Accordingly, a very high precision in the relative positioning of the LED and the optical element may be achieved. Further, the dimensions of the at least one positioning component and the at least one recess may be closely matched, providing for a very accurate positioning of the optical element with respect to the circuit board.

According to a further embodiment, the optical element comprises at least one protrusion and the circuit board comprises at least one drilled hole, with each of the at least one protrusion being arranged in an associated one of the at least one drilled hole. The provision of the protrusion(s) and the drilled hole(s) is a further effective means of achieving a highly accurate positioning between the optical element and the circuit board. The dimensions of the protrusion(s) and the drilled hole(s) may be closely matched, such that a high precision in the positioning of the optical element may be achieved. Further, during manufacturing of the lighting device, the at least one drilled hole may be drilled, after the LED is soldered to the circuit board. In particular, the at least one drilled hole may be drilled, taking the LED position as a reference. In this way, a highly accurate relative positioning between the optical element and the LED may be achieved, taking into account potential swimming or shifting of the LED during the soldering to the circuit board.

According to a further embodiment, the optical element comprises a self-aligning hinge mechanism arranged around the LED. In particular, the optical element may comprise two or more hinges arranged around the LED. The hinges may be configured to close around the LED when the optical element is pressed towards the circuit board. In this way, the optical element will come to lie in a fixed relative position with respect to the LED during manufacture of the lighting device. A very accurate positioning of the optical element may be achieved, with the provision of the optical element on the circuit board being de-coupled from the soldering of the LED to the circuit board.

According to a further embodiment, the lighting device comprises a plurality of design units, with each of the plurality of design units are comprising an LED and an optical element, as described above. The additional features, modifications and effects, described above with respect to a single design unit, consisting of an LED and an optical element, may apply to each of the plurality of design units in an analogues manner. In this way, the beneficial effects described above may be made use of to a particularly high degree. For example, the plurality of design units may be substantially aligned, such that a very bright output in a particular light output direction may be achieved with high accuracy. For example, a high light intensity and a high degree of collimation may be achieved at the same time.

According to a further embodiment, the lighting device is a lighting device for an aircraft. The magnetic coupling between the circuit board and the optical element may have sufficient mechanical strength to withstand impacts and vibrations, typically encountered in an aircraft environment, such as for example at touch-down of the aircraft. The strong mechanical attachment between the circuit board and the optical element via the magnetic coupling and the accurate relative positioning between the optical element and the LED are particularly beneficial in the field of aircraft lighting, with the resulting aircraft lights working reliably and working closely to the specification. In this way, the maintenance efforts for the aircraft lights and, thus, the downtime of the aircraft may be kept particularly low. It is pointed out that the lighting device may also be provided for other applications. In particular, the lighting devices described herein are well-suited for applications where high mechanical robustness and/or a highly accurate light output is desired. Also, the lighting devices described herein are well-suited for applications where high manufacturing numbers are to be achieved and where efficient manufacturing is of high importance.

According to a further embodiment, the lighting device is an exterior aircraft light, in particular an aircraft headlight. The high mechanical strength of the attachment between the circuit board, the optical element, and the LED as well as the accurate relative positioning between the LED and the optical element are particularly beneficial in the field of exterior aircraft lighting. High accuracy in the light output and high mechanical reliability may be achieved simultaneously.

According to a further embodiment, the lighting device is one of a helicopter search light, an aircraft taxi light, an aircraft take-off light, an aircraft landing light, an aircraft runway turn-off light, and a multi-purpose aircraft head light having at least two functionalities of an aircraft taxi light, an aircraft take-off light, an aircraft landing light, and an aircraft runway turn-off light. The multi-purpose aircraft headlight may have any subset or all of the functionalities of an aircraft taxi light, an aircraft take-off light, an aircraft landing light, and an aircraft runway turn-off light. With the strong mechanical attachment between the optical element and the circuit board, the lighting device is very well-suited for the demanding environment of aircraft headlights, such as well-suited for strong headwinds and heavy impacts/vibrations, e.g. when mounted to a running gear of an aircraft. Also, a high accuracy of the light output allows for the pilot(s) of the aircraft to have good visibility of the aircraft environment, such as a good visibility of the landing runway in case of a landing light.

According to a further embodiment, the lighting device is an interior aircraft light. In a particular embodiment, the interior aircraft light is a personal reading light for being provided in an aircraft cabin. With the high accuracy of the light output of the personal reading light, a sufficient illumination of the passenger's personal space may be achieved in an efficient manner, without disturbing passengers in adjacent seats.

Exemplary embodiments of the invention further include an aircraft, comprising at least one lighting device in accordance with any of the embodiments described above. The additional features, modifications and effects, described above with respect to the exemplary embodiments of the lighting device, apply to the aircraft in an analogous manner. The aircraft may be an airplane or a rotorcraft, such a helicopter, or an unmanned aerial vehicle.

Exemplary embodiments of the invention further include a method for manufacturing a lighting device, comprising: soldering an LED to a circuit board; positioning an optical element on the circuit board for re-directing at least part of the light in operation emitted by the LED; and attaching the optical element to the circuit board via a magnetic coupling between the optical element and the circuit board. The additional features, modifications and effects, described above with respect to exemplary embodiments of the lighting device, apply to the method for manufacturing a lighting device in an analogous manner. The positioning of the optical element on the circuit board and the attaching of the optical element to the circuit board may take place at substantially the same time. It is also possible that portions of the positioning of the optical element to the circuit board, such as providing a framework for reliably positioning the optical element on the circuit board and/or fine-tuning the position of the optical element on the circuit board, may take place before or after the attaching of the optical element to the circuit board.

According to a further embodiment, the positioning of the optical element on the circuit board comprises soldering the optical element to the circuit board via at least one surface mounted device pin. In this case, all of the soldering of the LED to the circuit board, the positioning of the optical element on the circuit board, and the attaching of the optical element to the circuit board may take place in the same manufacturing step, i.e. substantially at the same time.

According to a further embodiment, the positioning of the optical element on the circuit board comprises: soldering at least one positioning component, in particular at least one positioning LED, to the circuit board; and inserting the at least one positioning component into at least one corresponding recess in the optical element. In this case, the soldering of the LED to the circuit board and part of the positioning of the optical element on the circuit board, namely the provision of the positioning framework via the at least one positioning component, may take place at the same time. The engaging of the optical element and the circuit board as well as the attaching of the optical element to the circuit board via the magnetic coupling may take place in a later manufacturing step.

According to a further embodiment, the positioning of the optical element on the circuit board comprises: drilling at least one hole into the circuit board; and inserting at least one protrusion of the optical element into the at least one hole in the circuit board. The drilling of the at least one hole into the circuit board may take place, after the LED has been soldered to the circuit board. In particular, the LED may function as a positional reference for drilling the at least one hole into the circuit board. The engaging of the optical element and the circuit board as well as the attaching of the optical element to the circuit board via the magnetic coupling may thus take place after the soldering of the LED to the circuit board and after the drilling of the at least one hole into the circuit board.

According to a further embodiment, the positioning of the optical element on the circuit board comprises aligning the optical element with the LED via a hinge mechanism in the optical element. The aligning of the optical element with the LED via the hinge mechanism may take place in the same manufacturing step as the attaching of the optical element to the circuit board via the magnetic coupling, i.e. substantially at the same time. The hinge mechanism may comprise two or more hinges that are arranged around and engage with the LED in the course of the aligning of the optical element with the LED.

BRIEF DESCRIPTION OF THE FIGURES

Further exemplary embodiments of the invention will be described with respect to the accompanying drawings, wherein.

DETAILED DESCRIPTION

FIG. 1 shows a lighting device 2 in accordance with a first exemplary embodiment of the invention in various views. FIG. 1A shows the lighting device 2 in a schematic top view. FIG. 1B shows the lighting device 2 in a schematic vertical cross-sectional view, with the cross-section being indicated by line A-A in FIG. 1A. FIG. 1C shows the lighting device 2 in the same schematic top view as FIG. 1A. FIG. 1D shows the lighting device 2 in another schematic vertical cross-sectional view, with the cross-section being indicated by line B-B in FIG. 1C.

The lighting device 2 of FIG. 1 comprises a circuit board 4, which is a printed circuit board in the exemplary embodiment of FIG. 1, an LED 6, soldered to the circuit board 4, and a reflector 8. The reflector 8 is an optical element associated with the LED 6 for conditioning the light emitted by the LED 6. The reflector 8 is a parabolic reflector. The reflective surface of the reflector 8 is substantially rotationally symmetric around the LED 6, with the LED 6 being positioned on the center axis of the reflector 8. The reflector 8 is arranged for collimating part of the light emitted by the LED 6 in a main light output direction, which is towards the observer in the viewing direction of FIG. 1A and upwards in the viewing direction of FIG. 1B. The reflector 8 is referred to as a parabolic reflector, because vertical cross-sections through the reflector 8 result in parabolic curves of the reflective surface. The reflector 8 may also be spherical or have any other suitable shape for affecting the light from the LED 6 in a desired manner. In particular, the reflector 8 may have any other suitable concave shape, as seen from the LED 6.

The lighting device 2 further comprises three magnetic couplings 10 between the reflector 8 and the circuit board 4. In the top view of FIG. 1A, the magnetic couplings 10 are blocked from view by the reflector 8. However, in order to illustrate their presence and positions in the top view of FIG. 1A, the magnetic couplings 10 are shown in phantom. The magnetic couplings 10 are uniformly distributed around the circumference of the reflector 8. When seen from the LED 6, the magnetic couplings 10 are spaced by 120° angles, respectively.

The reflector 8 comprises two surface mounted device pins (SMD pins) 20, which are soldered to the circuit board 4. In the top view of FIG. 1A, the SMD pins 20 are blocked from view by the reflector 8. However, in order to show their presence and positions, the SMD pins 20 are shown in phantom.

Figure 1A:
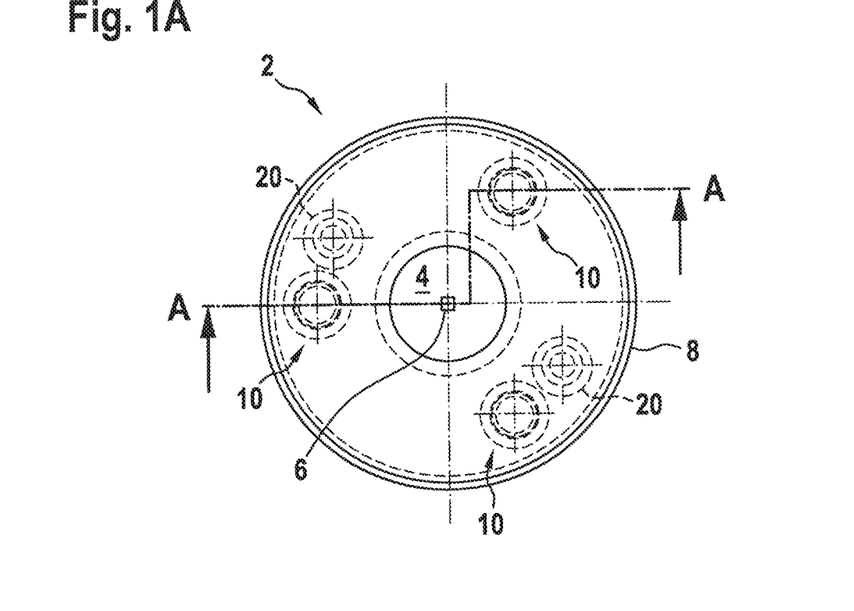
FIGS. 1A-1D show a lighting device in accordance with a first exemplary embodiment of the invention in various views.
Figure 1B:
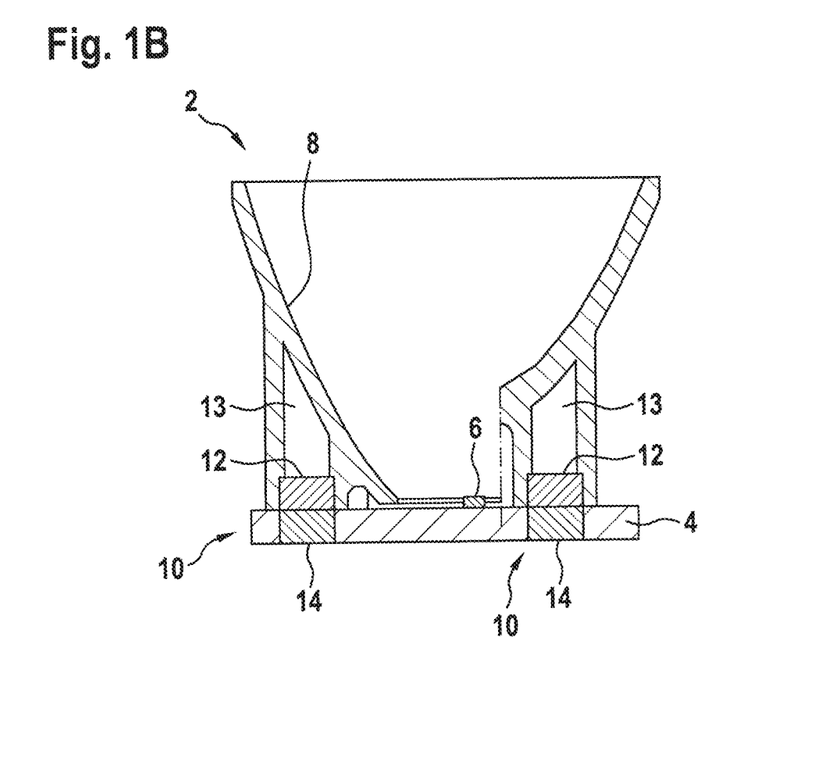

As stated above, FIG. 1B shows a schematic vertical cross-sectional view of the lighting device 2. The view of FIG. 1B is considered vertical, because the circuit board 4 is considered a horizontal structure, because it is generally oriented horizontally during manufacture of the lighting device 2. However, it is understood that the circuit board 4 may have any suitable orientation in operation of the lighting device 2 and that the depicted cross-section of FIG. 1B does not have to be vertical in operation of the lighting device 2. The cross-section of FIG. 1B is indicated by line A-A in FIG. 1A. Line A-A is not a straight line, but includes two 90° angles, when cutting through the lighting device 2. In this way, the cross-sectional view of FIG. 1B illustrates two magnetic couplings 10 as well as the position of the LED 6.

Each of the magnetic couplings 10 comprises a first permanent magnet 12 and a second permanent magnet 14. The first permanent magnets 12 are provided at the reflector 8. In particular, the first permanent magnets 12 are provided in corresponding recesses 13 of the reflector 8. The reflector 8 may have cylindrical protrusions on its lower side, i.e. on the side opposite the reflective surface, with channels within those cylindrical protrusions forming the recesses 13 for receiving the first permanent magnets 12. In the exemplary embodiment of FIG. 1, the first permanent magnets 12 are press-fit into the corresponding recesses 13. In the exemplary embodiment of FIG. 1, the first permanent magnets 12 fill out only a portion of the corresponding recesses 13. However, it is also possible that the first permanent magnets 12 fill out a larger portion or all of the corresponding recesses 13.

The second permanent magnets 14 are provided at the circuit board 4. In particular, the second permanent magnets 14 are press-fit into corresponding holes in the circuit board 4. In the exemplary embodiment of FIG. 1, the second permanent magnets 14 extend substantially through the entire thickness of the circuit board 4. However, it is also possible that the second permanent magnets 14 extend through only a portion of the thickness of the circuit board 4.

The first permanent magnets 12 and the second permanent magnets 14 are of opposite polarities. In this way, an attractive force exists between the first permanent magnet 12 and the second permanent 14 of each magnetic coupling scene. The attractive forces of the magnetic couplings 10 combine to provide a firm attachment between the reflector 8 and the circuit board 4. In the exemplary embodiment of FIG. 1, the magnet contact surfaces of the first permanent magnets 12 on the one hand and the second permanent magnets 14 on the other hand are substantially co-extensive. However, it is also possible that the magnet contact surfaces differ among the first permanent magnets 12 and the second permanent magnets 14.

In the exemplary embodiment of FIG. 1, each of the magnetic couplings 10 comprises a first permanent magnet 12 and a second permanent magnet 14. It is also possible that the second permanent magnets 14 are replaced by ferromagnetic elements. These ferromagnetic elements are attracted to the first permanent magnets 12, therefore also resulting in a firm attachment between the reflector 8 and the circuit board 4. Alternatively, it is also possible that the first permanent magnets 12 are replaced by ferromagnetic elements. These ferromagnetic elements are attracted to the second permanent magnets 14, therefore also resulting in a firm attachment between the reflector 8 and the circuit board 4. These three alternatives for the magnetic couplings 10 may be employed in all of the embodiments described herein.

Figure 1C:
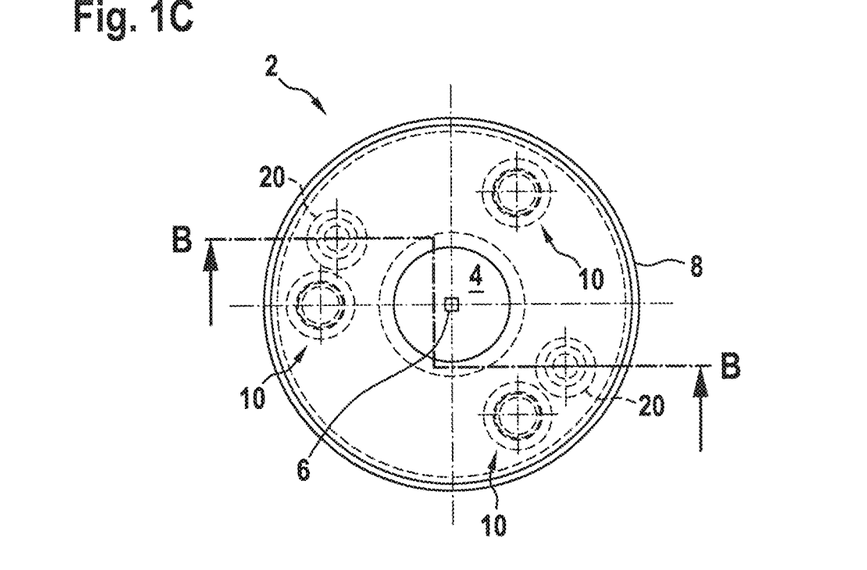

FIG. 1C shows the lighting device 2 of FIGS. 1A and 1B in the same schematic top view as FIG. 1A. However, FIG. 1C indicates the vertical cross-section of FIG. 1D via line B-B. Line B-B does not run straight through the lighting device 2, but has two 90° angles along its way. The vertical cross-sectional view of FIG. 1D runs through both SMD pins 20, briefly introduced above with respect to FIG. 1A.

Figure 1D:
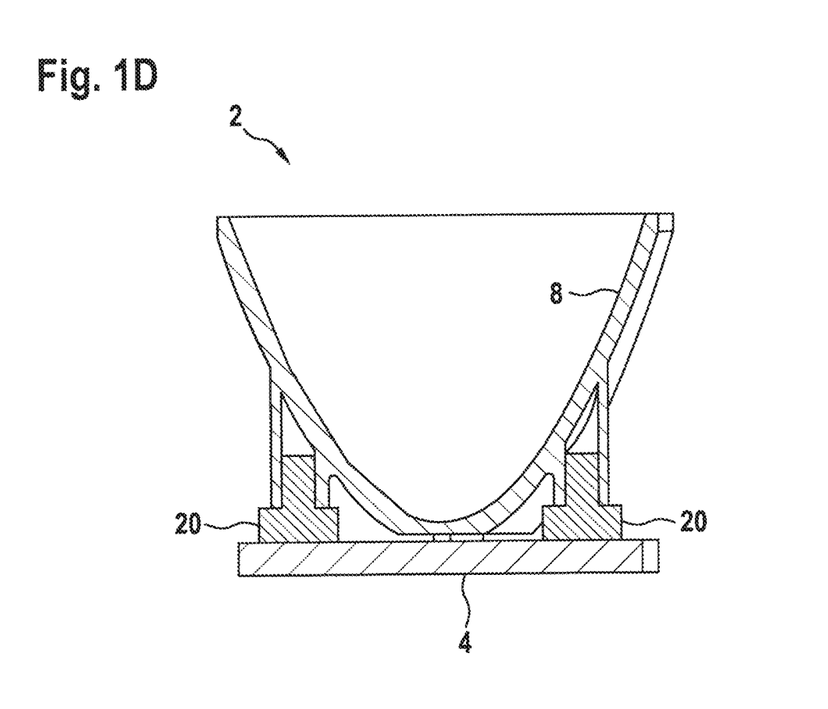

As stated above, the reflector 8 comprises two SMD pins 20. The SMD pins 20 are provided on the side of the reflector 8 facing the circuit board 4. The SMD pins 20 are soldered to the circuit board 4. The SMD pins 20 provide for a fixed positioning of the reflector 8 with respect to the circuit board 4. While the magnetic couplings 10, as described above, prevent the reflector 8 from disengaging from the circuit board 4 in the z-direction of the circuit board 4. The SMD pins 20 prevent for a shifting of the reflector 8 along the circuit board 4. The position of the reflector 8 with respect to the circuit board 4 is fixed, which in turn also fixes the relative position between the LED 6 and the reflector 8.

During manufacture of the lighting device 2, the LED 6 is soldered to the circuit board 4 and the SMD pins 20 are soldered to the circuit board 4. In particular, the LED 6 and the SMD pins 20 may be soldered to the circuit board 4 in the same manufacturing step. In this way, the LED 6 and the SMD pins 20 may swim or shift in the same or substantially the same manner, while the solder is still liquid. This in turn will ensure that a very accurate relative positioning between the reflector 8 and the LED 6 is maintained.

Figure 2A:
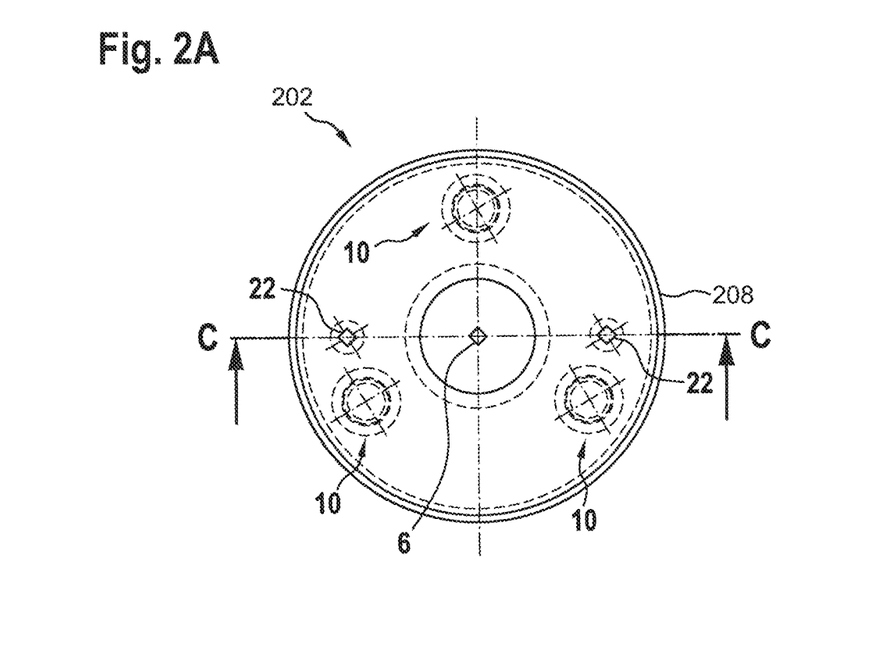
FIGS. 2A-2B show a lighting device in accordance with a second exemplary embodiment of the invention in various views.
Figure 2B:
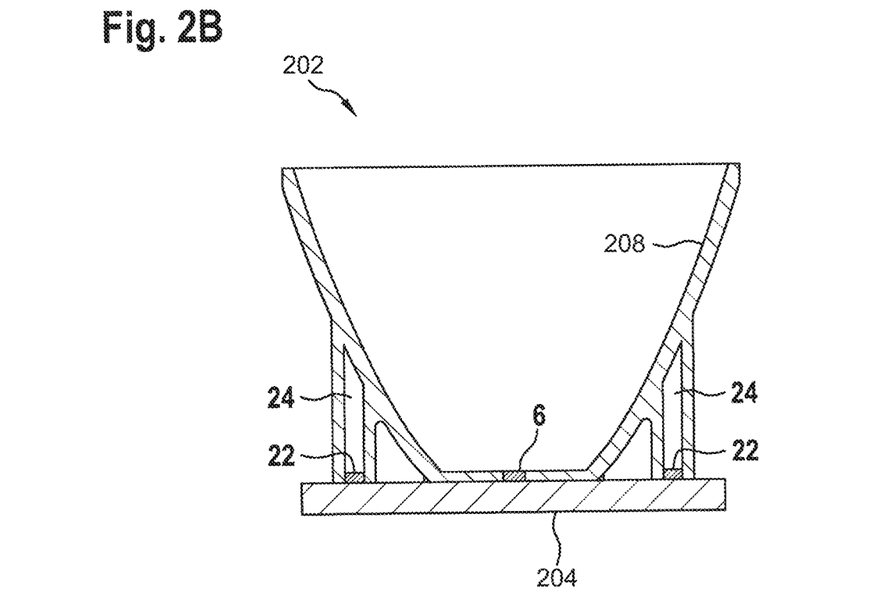

FIG. 2 shows a lighting device 202 in accordance with a second exemplary embodiment of the invention in various views. FIG. 2A shows the lighting device 202 in a schematic top view. FIG. 2B shows the lighting device 2 in a schematic vertical cross-sectional view.

The lighting device 202 of FIG. 2 also comprises a circuit board 204, an LED 6, a reflector 208, and three magnetic couplings 10. The circuit board 204, the LED 6, and the magnetic couplings 10 of the lighting device 202 of FIG. 2 correspond to the according components of the lighting device 2 of FIG. 1. They are not discussed in detail again, and reference is made to their description above.

The positioning between the reflector 208 and the circuit board 204 of the lighting device 202 of FIG. 2 is different, as compared to the positioning between those components in the lighting device 2 of FIG. 1. The lighting device 202 of FIG. 2 comprises two positioning LEDs 22. The positioning LEDs 22 are soldered to the circuit board 204. In the top view of FIG. 2A, the positioning LEDs 22 are blocked from view by the reflector 208, and they are shown in phantom in FIG. 2A. The cross-sectional plane of FIG. 2B is indicated by line C-C in FIG. 2A, and this cross-sectional plane runs through the two positioning LEDs 22.

The reflector 208 has two recesses 24 for receiving the two positioning LEDs 22. The two recesses 24 are channels within cylindrical protrusions extending from the side of the reflector 208 facing the circuit board 204. The lateral extensions of the recesses 24 substantially correspond to the lateral extensions of the positioning LEDs 22. In the exemplary embodiment of FIG. 2, the reflector 208 also has an opening on its center axis, whose dimensions substantially correspond to the dimensions of the LED 6. In the assembled state of the lighting device 202, the two positioning LEDs 22 are received in the corresponding recesses 24 of the reflector 208 and the LED 6 is received in the corresponding hole in the center portion of the reflector 208.

During manufacture of the lighting device 202, the LED 6 and the positioning LEDs 22 are soldered to the circuit board 204. In particular, the LED 6 and the positioning LEDs 22 may be soldered to the circuit board 204 in the same manufacturing step. In this way, the positions of the LED 6 and of the positioning LEDs 22 may be affected in the same or substantially the same manner, when swimming or shifting while the solder is still liquid. Accordingly, a very accurate relative positioning between the LED 6 and the reflector 208 may be achieved.

Figure 3A:
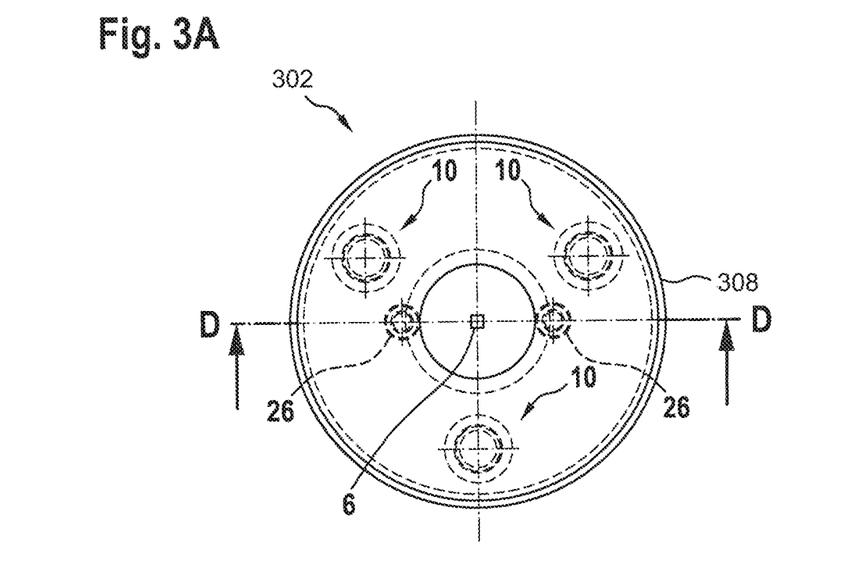
FIGS. 3A-3B show a lighting device in accordance with a third exemplary embodiment of the invention in various views.
Figure 3B:
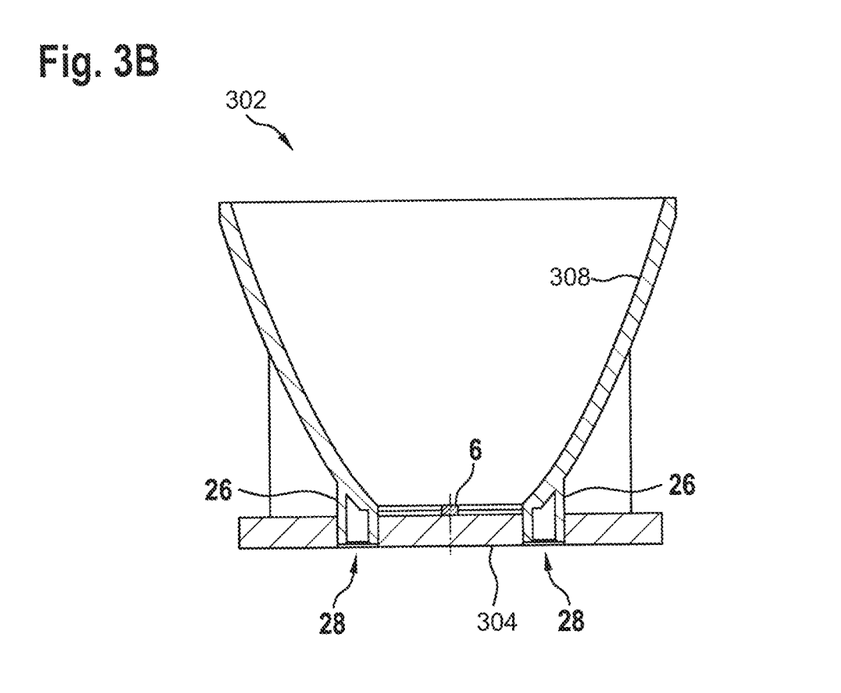

FIG. 3 shows a lighting device 302 in accordance with a third exemplary embodiment of the invention in various views. FIG. 3A shows the lighting device 302 in a schematic top view. FIG. 3B shows the lighting device 302 in a schematic vertical cross-sectional view.

The lighting device 302 of FIG. 3 also comprises a circuit board 304, an LED 6, a reflector 308, and three magnetic couplings 10. The LED 6 and the magnetic couplings 10 of the lighting device 302 correspond to the according components of the lighting device 2 of FIG. 1. They are not discussed in detail again, and reference is made to their description above. The circuit board 304 of the lighting device 302 of FIG. 3 corresponds to the circuit board 304 of the lighting device 2 of FIG. 1, with the exception of drilled holes 28 discussed below.

The positioning of the reflector 308 with respect to the circuit board 4 is different in the lighting device 302 of FIG. 3, as compared to the positioning of those components in the lighting device 2 of FIG. 1. In the exemplary embodiment of FIG. 3, the reflector 308 comprises two protrusions 26, extending towards and into the circuit board 304. In particular, each of the two protrusions 26 extends into a corresponding drilled hole 28 in the circuit board 304. As the protrusions 26 are on the side of the reflector 308 facing the circuit board 304, they are blocked from view in the top view of FIG. 3A. They are therefore shown in phantom in FIG. 3A. Line D-D indicates the cross-sectional plane of FIG. 3B in FIG. 3A. The cross-sectional plane of FIG. 3B runs through the two protrusions 26 of the reflector 308.

The protrusions 26 are provided around a lower end of the reflector 308, i.e. around a region of the reflector 308 where the reflective surface comes close to the circuit board 304. However, it is pointed that the protrusions 26 may also be arranged at different portions of the reflector 8. In the assembled state, the protrusions 26 are received by the corresponding drilled holes 28 in the circuit board 304. In this way, the positioning between the reflector 308 and the circuit board 304 is fixed. This in turn means that the relative positioning between the reflector 308 and the LED 6 is also fixed.

During manufacture, the LED 6 may be soldered to the circuit board 304 in a particular manufacturing step. In a subsequent manufacturing step, the drilled holes 28 may be drilled into the circuit board 4, taking the position of the LED 6 as a reference. In a further manufacturing step, the reflector 308 may be positioned with respect to the circuit board 304 by inserting the protrusions 26 into the drilled holes 28. In this way, an accurate relative positioning between the LED 6 and the reflector 308 may be achieved. With the drilled holes 28 being created after the soldering of the LED 6 to the circuit board 304, the relative positioning between the LED 6 and the reflector 308 may be made independent from the LED 6 swimming or shifting on the circuit board 304 during soldering. At the same time as inserting the protrusions 26 into the drilled holes 28, the magnetic attachment between the reflector 308 and the circuit board 304 via the magnetic couplings 10 is effected.

Figure 4A:
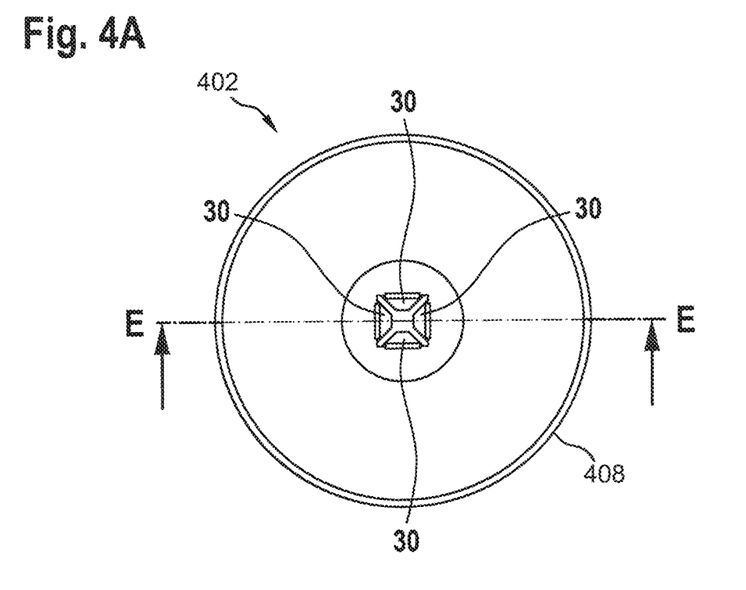
FIGS. 4A-4C show a lighting device in accordance with a fourth exemplary embodiment of the invention in various views.
Figure 4B:
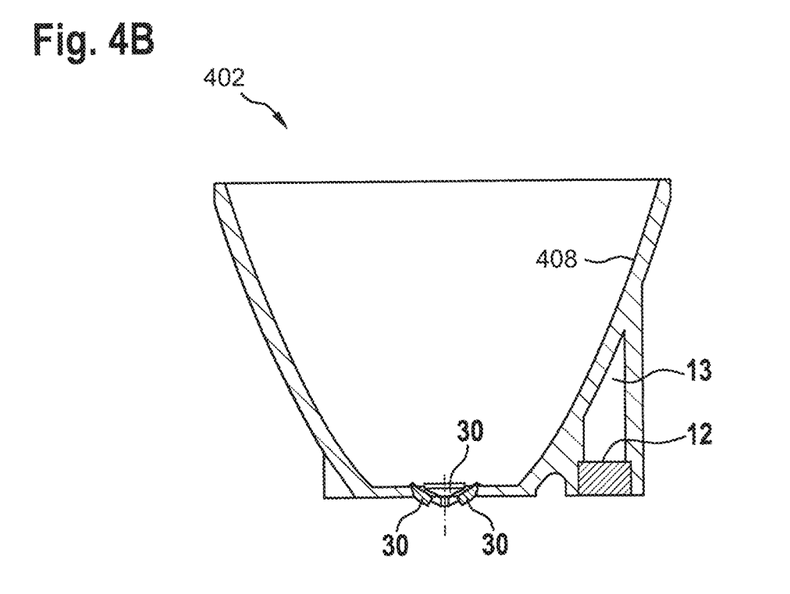
Figure 4C:
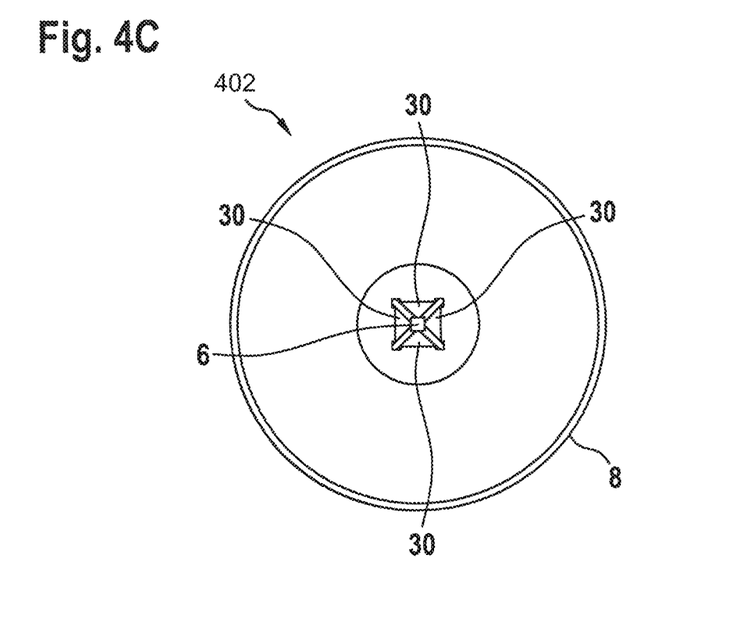

FIG. 4 shows a lighting device 402 in accordance with a fourth exemplary embodiment of the invention in various views. FIG. 4A shows the lighting device 402 in a schematic top view, with the hinge mechanism discussed below being open. FIG. 4B shows the lighting device 402 in a schematic vertical cross-sectional view. FIG. 4C shows the lighting device 402 in a schematic top view, with the hinge mechanism being closed.

The lighting device 402 of FIG. 4 also comprises a circuit board, and LED 6, a reflector 408, and three magnetic couplings. The circuit board, the LED 6, and the magnetic couplings of the lighting device 402 of FIG. 4 corresponds to the according components of the lighting device 2 of FIG. 1. They are not discussed in detail again, and reference is made to the description above. Also, for a clearer illustration, the circuit board, including the second permanent magnet of the magnetic coupling, is not depicted in FIG. 4. Also, the magnetic couplings are not shown in phantom in the schematic top views of FIGS. 4A and 4C.

The positioning between the reflector 208 and the circuit board of the lighting device 202 of FIG. 2 is different, as compared to the positioning between those components in the lighting device 2 of FIG. 1. The reflector 408 of the lighting device 402 of FIG. 4 comprises a hinge mechanism, having four hinges 30. The four hinges 30 are provided in the lower portion of the reflector 408 around its center axis. The four hinges 30 are substantially triangular flaps. The long sides of the triangular flaps are attached to the reflector 8 and form a square around the center axis of the reflector 408. The two shorter sides of the triangular flaps extend substantially from the corners of said square towards substantially the center axis of the reflector 408. In the absence of any force acting on the hinges 30, the described triangular flaps dangle from the reflector 8 in the direction of the circuit board. With the hinges 30 dangling in the direction of the circuit board, the opening between the hinges 30 is larger than the LED 6 of the lighting device 402. This is illustrated in FIGS. 4A and 4B, with FIG. 4B showing the cross-sectional plane indicated by line E-E in FIG. 4A.

During the manufacture of the lighting device 402, the reflector 408 is pressed down onto the circuit board. During this procedure, the LED 6 is positioned in the opening between the four hinges 30. The engagement between the reflector 408 and the circuit board pushes the hinges 30 upwards. As a consequence, the hinges 30 tighten around the LED 6 and, thus, self-align the reflector 408 with the LED 6. The closed position of the hinges 30 with respect to the LED 6 is illustrated in the top view of FIG. 4C.

As described above, FIGS. 1 to 4 show different ways of positioning the reflector 8 with respect to the circuit board 4. It is pointed out that these different ways are not mutually exclusive. Rather, the positioning mechanisms of the lighting devices 2, 202, 302, 402 of FIGS. 1 to 4 may be combined in any suitable manner. In particular, any subset of the positioning via SMD pins, via positioning components soldered to the circuit board, via protrusions of the reflector extending into the circuit board, and via a hinge mechanism may be present.

Figure 5:
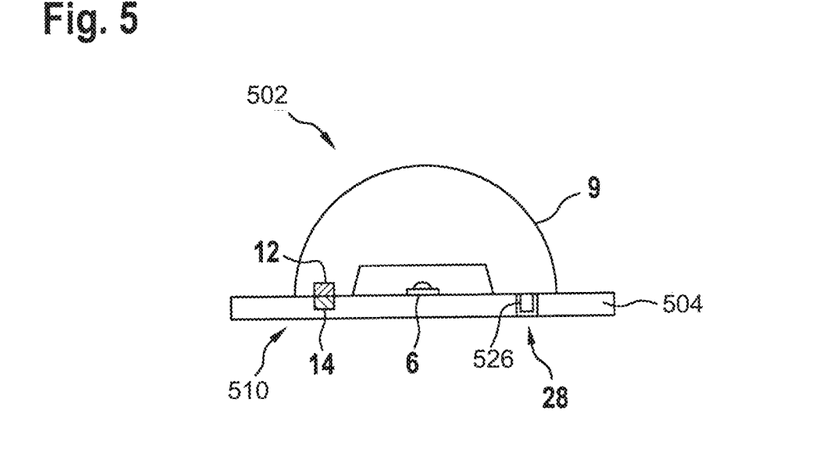
FIG. 5 shows a lighting device in accordance with a fifth exemplary embodiment of the invention in a schematic cross-sectional view.

FIG. 5 shows a lighting device 502 in accordance with a fifth exemplary embodiment of the invention in a schematic vertical cross-sectional view. The lighting device 502 of FIG. 5 comprises a circuit board 504, in particular a printed circuit board, an LED 6, an optical element in the form of lens 9, and a magnetic coupling 510 having a first permanent magnet 12 at the lens 9 and a second permanent magnet 14 at the circuit board 504. The lens 9 is a refractive optical element that is arranged over the LED 6 for re-directing the light emitted by the LED 6.

As stated above, a magnetic coupling 510 is provided between the lens 9 and the circuit board 4. In particular, a first permanent magnet 12 is press-fit into the lens 9, and a second permanent magnet 14 is press-fit into the circuit board 514. Further, the lens 9 comprises a protrusion 526, which is received by a drilled hole 28 in the circuit board 514. The lens 9 is firmly attached and accurately positioned with respect to the circuit board 4 and, thus, with respect to the LED 6. Multiple magnetic couplings 10 and multiple protrusions/drilled holes may be present.

FIG. 5 illustrates that the concepts of attachment and positioning, as described with respect to the combination of a reflector and a circuit board with respect to FIGS. 1 to 4 above, also apply to the combination of a lens 9 and a circuit board 504. While a positioning similar to the positioning of FIG. 3 is described in FIG. 5, it is explicitly stated that the other positioning mechanisms, as described with respect to FIGS. 1, 2, and 4 are applicable as well.

Figure 6A:
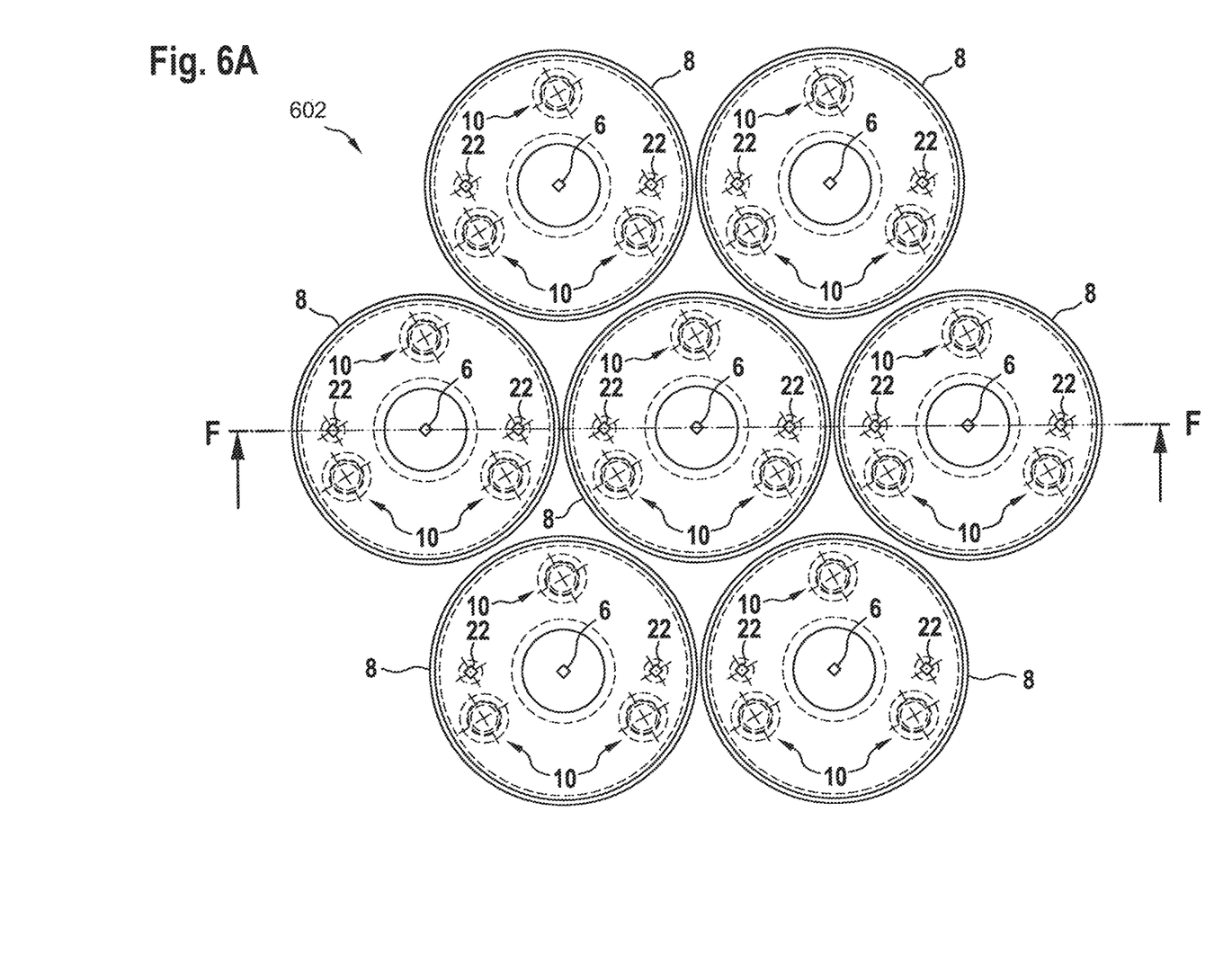
FIGS. 6A-6B show a lighting device in accordance with a sixth exemplary embodiment of the invention in various views.
Figure 6B:
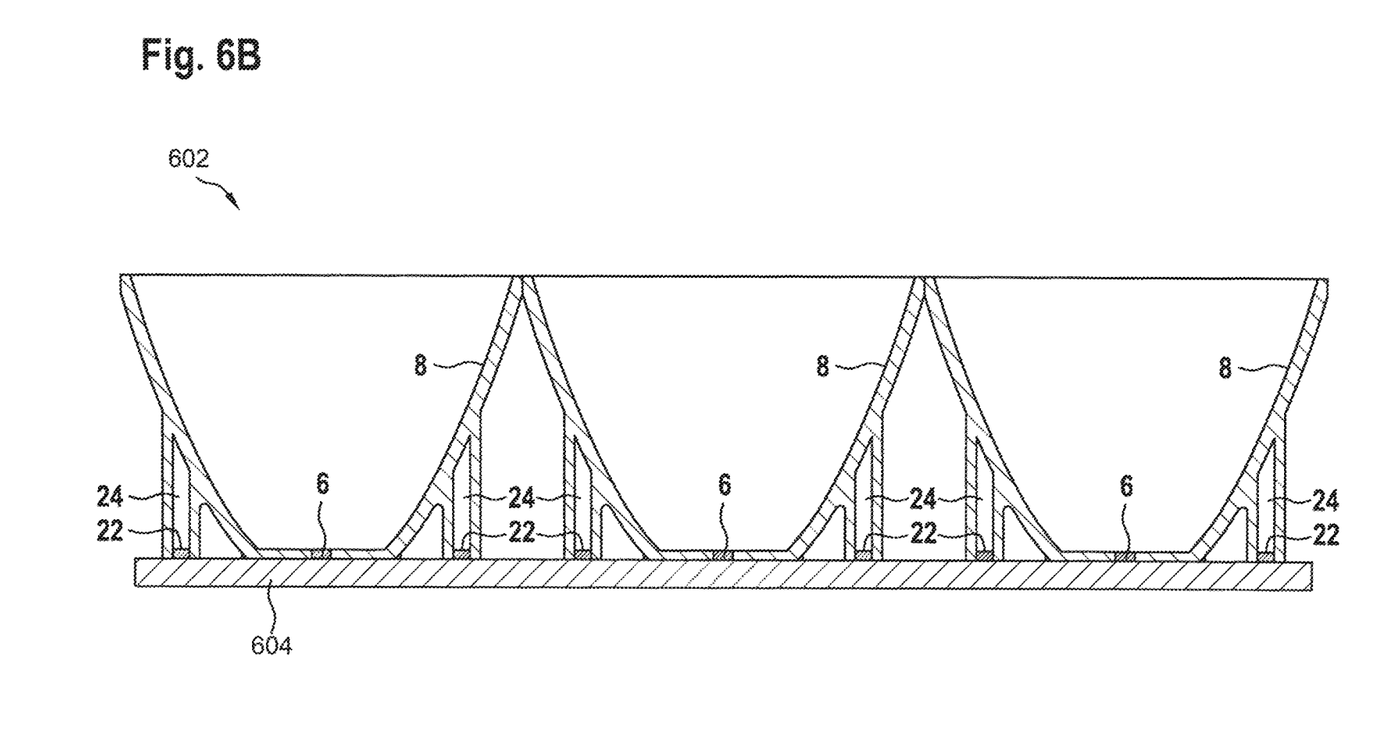

FIG. 6 shows a lighting device 602 in accordance with a sixth exemplary embodiment of the invention in various views. FIG. 6A shows the lighting device 2 in a schematic top view. FIG. 6B shows the lighting device 2 in a schematic vertical cross-sectional view. The cross-sectional plane of FIG. 6B is indicated by line F-F in FIG. 6A.

The lighting device 602 of FIG. 6 has a plurality of design units, also referred to as structural units or building blocks, each comprising an LED 6 and an optical element, which is a reflector 8 in the exemplary embodiment of FIG. 6. The plurality of design units are arranged on a common circuit board 604, which is a printed circuit board in the exemplary embodiment of FIG. 6. For each of the design units, one or more magnetic couplings between the circuit board 604 and the reflector 8 may be provided. In the exemplary embodiment of FIG. 6, three magnetic couplings 10 are provided per design unit for attaching the reflector 8 to the circuit board 604, as described above with respect to FIG. 1. Further, for each design unit, two positioning components in the form of positioning LEDs 22 are provided for positioning the reflector 8 with respect to the circuit board 604, as described above with respect to FIG. 2.

In the exemplary embodiment of FIG. 6, seven LEDs 6 and seven reflectors 8, each reflector 8 being associated with one LED 6, are provided. The seven structural units, consisting of an LED 6 and a reflector 8 each, are arranged in a very dense manner, with one structural unit being arranged at the center and the six other structural units being arranged therearound.

The light outputs of the structural units may re-inforce each other. As a result, the lighting device 2 has a very bright light output towards the observer in the viewing direction of FIG. 6A and towards the top in the viewing direction of FIG. 6B. The collimation via the reflectors 8 may have high accuracy due to the accurate positioning of the reflectors 8 with respect to the LEDs 6, such that a highly collimated light output may be achieved. With all reflectors 8 being attached to the circuit board 4 via magnetic couplings 10, a strong attachment between the reflectors 8 and the circuit board 4 is also achieved.

Figure 7:
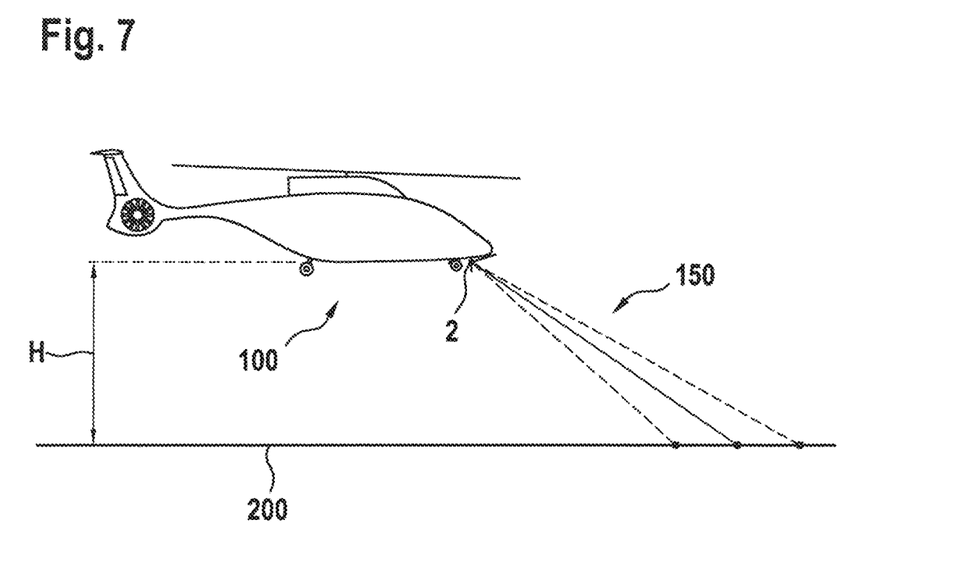
FIG. 7 shows a helicopter in accordance with an exemplary embodiment of the invention in a side view, the helicopter being equipped with a helicopter search light in accordance with an exemplary embodiment of the invention.

FIG. 7 shows a helicopter 100 in accordance with an exemplary embodiment of the invention, equipped with a lighting device 2 in accordance with an exemplary embodiment of the invention, in a side view. The helicopter 100 is depicted as flying at a height H above ground 200. The helicopter 100 is equipped with a helicopter search light 2, mounted to a front bottom portion of the helicopter 100 and generating a light beam 150, which is directed downwards in front of the helicopter 100. For generating the light beam 150, the helicopter search light 2 may be embodied in accordance with any of the embodiments of lighting devices 2, described herein. The helicopter search light 2 may also be arranged at a different location of the helicopter 100, such as at the front running gear.

Figure 8:
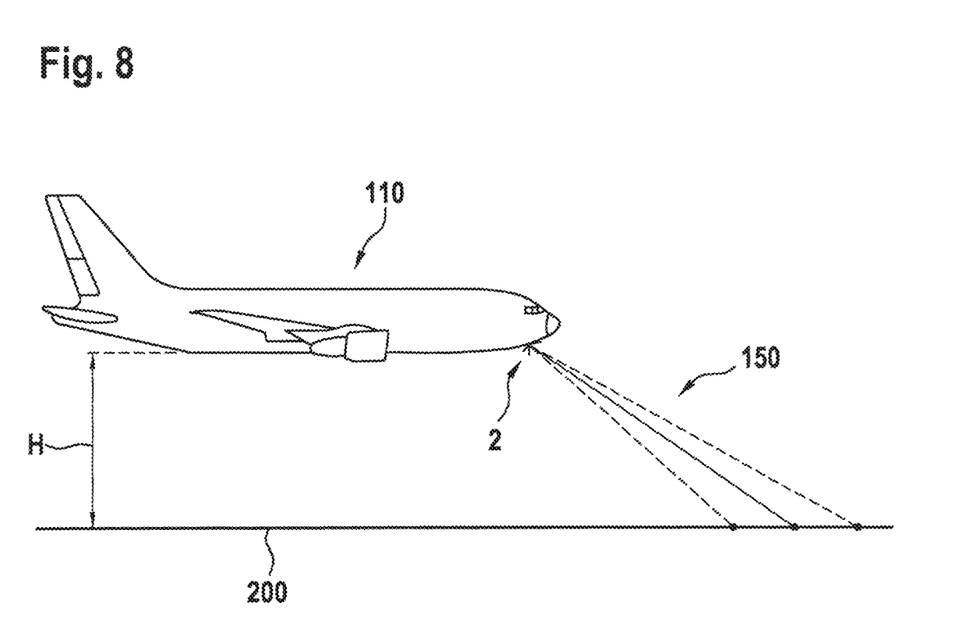
FIG. 8 shows an airplane in accordance with an exemplary embodiment of the invention in a side view, the airplane being equipped with an aircraft headlight in accordance with an exemplary embodiment of the invention.

FIG. 8 shows an airplane 110 in accordance with an exemplary embodiment of the invention, equipped with a lighting device 2 in accordance with an exemplary embodiment of the invention, in a side view. The airplane 110 is depicted as flying at a height H above ground 200. The airplane 110 is equipped with an aircraft headlight 2, which is an aircraft landing light 2 in the exemplary embodiment of FIG. 8. The aircraft headlight 2 is mounted to a front bottom portion of the airplane 110 and generates a light beam 150, which is directed downwards in front of the airplane 110. For generating the light beam 150, the aircraft headlight 2 may be embodied in accordance with any of the embodiments of lighting devices 2, described herein. The aircraft headlight 2 may also be arranged at a different location of the airplane 110, such as at the front running gear.

Figure 9:
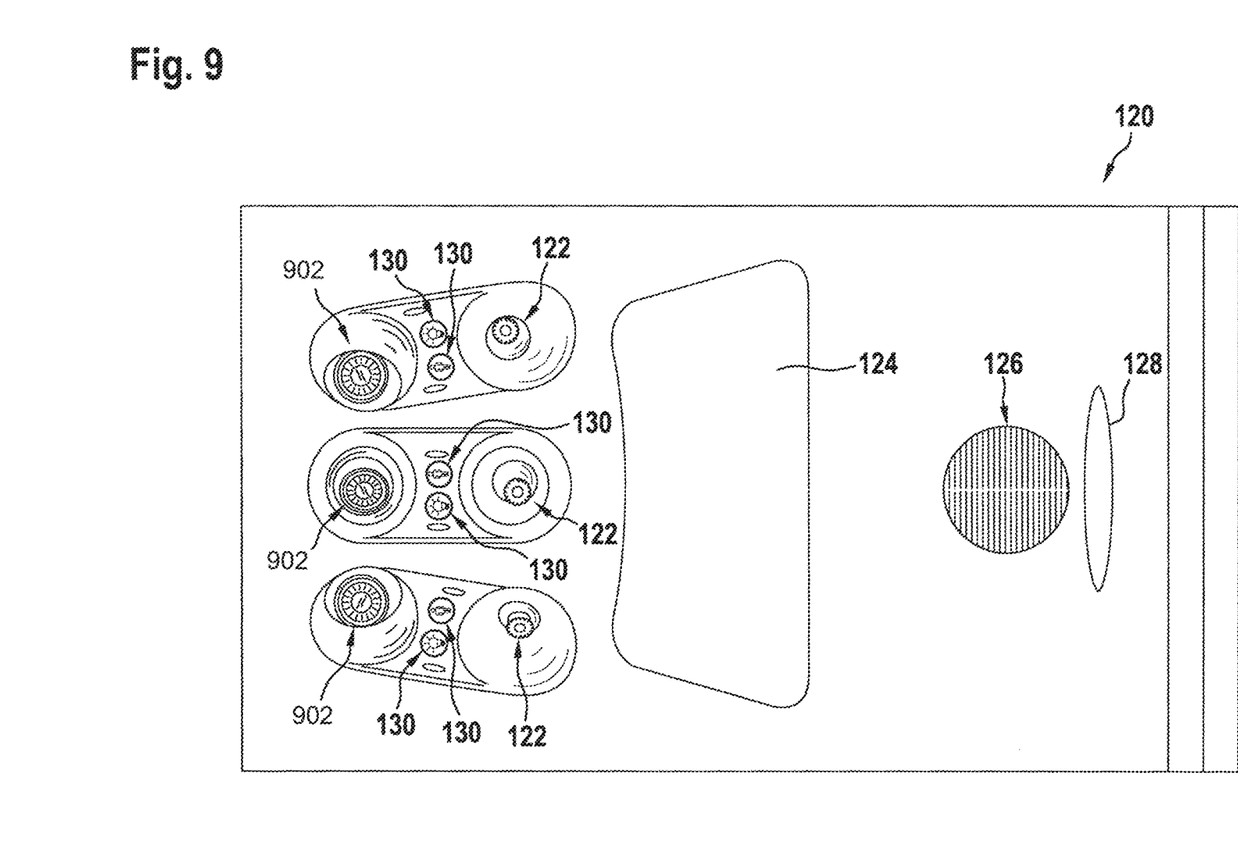
FIG. 9 shows an overhead passenger service unit, comprising reading lights in accordance with exemplary embodiments of the invention, in a schematic view.

FIG. 9 shows an overhead passenger service unit 120, as it may be installed in the passenger cabin of an aircraft, in a schematic view from the point of view of a passenger sitting below the overhead passenger service unit 120.

On the side depicted to the left in FIG. 9, the overhead passenger service unit 120 comprises a row of three adjustable personal reading lights 902, arranged next to each other in a lateral direction. Each of the personal reading lights 902 may be embodied in accordance with any of the embodiments of lighting devices, described herein.

Six electrical switches 130 are provided to the right side of the personal reading lights 902, a pair of two switches 130 next to each of the personal reading lights 902. One of the switches 130 of each pair may be configured for switching the adjacent personal reading light 902, while the second switch of each pair may be configured for triggering a signal for calling cabin service personnel.

A row of three adjacent gaspers 122 arranged in the lateral direction is provided next to the switches 130. The overhead passenger service unit 120 further comprises a loudspeaker 126, a display panel 128, and a covered cavity 124 for housing at least one oxygen mask (not shown).

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed, but that the invention will include all embodiments falling within the scope of the appended claims.

The invention claimed is:

1. Lighting device, comprising:
a circuit board;
an LED, soldered to the circuit board;
an optical element, supported by the circuit board and positioned for re-directing at least part of the light in operation emitted by the LED; and
a magnetic coupling between the circuit board and the optical element,
wherein the optical element comprises at least one surface mounted device pin, soldered to the circuit board.

2. The lighting device according to claim 1, wherein the optical element is one of a reflector or a lens.

3. The lighting device according to claim 1, wherein the magnetic coupling comprises one of:
a permanent magnet at the optical element and a ferromagnetic element at the circuit board;
a ferromagnetic element at the optical element and a permanent magnet at the circuit board; or
a first permanent magnet at the optical element and a second permanent magnet at the circuit board.

4. An aircraft comprising at least one lighting device in accordance with claim 1.

5. The lighting device according to claim 1, wherein the lighting device is an interior aircraft light.

6. The lighting device according to claim 5, wherein the interior aircraft light is a personal reading light.

7. The lighting device according to claim 1, wherein the lighting device is an exterior aircraft light.

8. The lighting device according to claim 7, wherein the exterior aircraft light is an aircraft headlight.

9. The lighting device according to claim 7, wherein the exterior aircraft light is one of a helicopter search light, an aircraft taxi light, an aircraft take-off light, an aircraft landing light, an aircraft runway turn-off light, and a multi-purpose aircraft headlight having at least two functionalities of an aircraft taxi light, an aircraft take-off light, an aircraft landing light, and an aircraft runway turn-off light.

10. Lighting device, comprising:
a circuit board;
an LED, soldered to the circuit board;
an optical element, supported by the circuit board and positioned for re-directing at least part of the light in operation emitted by the LED; and
a magnetic coupling between the circuit board and the optical element,
wherein the lighting device has one of the following features:
the lighting device further comprises at least one positioning LED, soldered to the circuit board and extending from the circuit board, wherein the optical element has at least one recess, with each of the at least one positioning LED being arranged in an associated one of the at least one recess; or
the optical element comprises at least one protrusion and the circuit board comprises at least one drilled hole, with each of the at least one protrusion being arranged in an associated one of the at least one drilled hole; or the optical element comprises a self-aligning hinge mechanism arranged around the LED.

11. The lighting device according to claim 10, wherein the optical element is one of a reflector or a lens.

12. The lighting device according to claim 10, wherein the magnetic coupling comprises one of:
- a permanent magnet at the optical element and a ferromagnetic element at the circuit board;
- a ferromagnetic element at the optical element and a permanent magnet at the circuit board; or
- a first permanent magnet at the optical element and a second permanent magnet at the circuit board.

13. An aircraft comprising at least one lighting device in accordance with claim 10.

14. The lighting device according to claim 10, wherein the lighting device is an interior aircraft light.

15. The lighting device according to claim 14, wherein the interior aircraft light is a personal reading light.

16. The lighting device according to claim 10, wherein the lighting device is an exterior aircraft light.

17. The lighting device according to claim 16, wherein the exterior aircraft light is an aircraft headlight.

18. The lighting device according to claim 16, wherein the exterior aircraft light is one of a helicopter search light, an aircraft taxi light, an aircraft take-off light, an aircraft landing light, an aircraft runway turn-off light, and a multi-purpose aircraft headlight having at least two functionalities of an aircraft taxi light, an aircraft take-off light, an aircraft landing light, and an aircraft runway turn-off light.

19. A method for manufacturing a lighting device, comprising:
- soldering an LED to a circuit board;
- positioning an optical element on the circuit board for re-directing at least part of the light in operation emitted by the LED; and
- attaching the optical element to the circuit board via a magnetic coupling between the optical element and the circuit board, wherein the positioning of the optical element on the circuit board comprises one of:
- soldering the optical element to the circuit board via at least one surface mounted device pin; or
- soldering at least one positioning LED to the circuit board, and inserting the at least one positioning LED into at least one corresponding recess in the optical element; or
- drilling at least one hole into the circuit board, with the drilling of the at least one hole into the circuit board in particular taking place after the soldering of the LED to the circuit board, and inserting at least one protrusion of the optical element into the at least one hole in the circuit board; or
- aligning the optical element with the LED via a hinge mechanism in the optical element.

* * * * *